(12) United States Patent
Fukuhara et al.

(10) Patent No.: US 10,446,987 B2
(45) Date of Patent: Oct. 15, 2019

(54) CONNECTOR DEVICE

(71) Applicant: Yazaki Corporation, Tokyo (JP)

(72) Inventors: Toshiaki Fukuhara, Shizuoka (JP); Fuminori Sugiyama, Shizuoka (JP); Yuki Mori, Shizuoka (JP); Kouzou Koshou, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/909,648

(22) Filed: Mar. 1, 2018

(65) Prior Publication Data

US 2018/0342841 A1 Nov. 29, 2018

(30) Foreign Application Priority Data

May 29, 2017 (JP) .................. 2017-105281

(51) Int. Cl.
| | |
|---|---|
| *H01R 13/66* | (2006.01) |
| *G01R 33/02* | (2006.01) |
| *G01R 15/20* | (2006.01) |
| *H01R 24/28* | (2011.01) |
| *G01R 1/04* | (2006.01) |
| G01R 19/00 | (2006.01) |
| H01R 13/24 | (2006.01) |
| H01R 11/12 | (2006.01) |

(52) U.S. Cl.
CPC ....... *H01R 13/6683* (2013.01); *G01R 1/0416* (2013.01); *G01R 15/207* (2013.01);
(Continued)

(58) Field of Classification Search
CPC ............. H01R 13/6683; H01R 24/28; H01R 13/6691; H01R 11/12; H01R 13/24;
(Continued)

(56) References Cited

U.S. PATENT DOCUMENTS

| | | | |
|---|---|---|---|
| 9,358,939 B2 | 6/2016 | Ohashi et al. | |
| 9,651,583 B2 | 5/2017 | Kawase | |
| | (Continued) | | |

FOREIGN PATENT DOCUMENTS

| | | |
|---|---|---|
| JP | 2008-224260 A | 9/2008 |
| JP | 2013-20822 A | 1/2013 |
| | (Continued) | |

OTHER PUBLICATIONS

Japanese Office Action for the related Japanese Patent Application No. 2017-105281 dated Apr. 16, 2019.

*Primary Examiner* — Abdullah A Riyami
*Assistant Examiner* — Nelson R. Burgos-Guntin
(74) *Attorney, Agent, or Firm* — Kenealy Vaidya LLP

(57) ABSTRACT

A connector device includes: a connection terminal including a first terminal connection portion electrically connected to a first counterpart terminal, a second terminal connection portion electrically connected to a second counterpart terminal, and a coupling portion having a flat plate shape, disposed between the first terminal connection portion and the second terminal connection portion electrically connected between the first terminal connection portion and the second terminal connection portion; a current sensor configured to measure current flowing in the coupling portion on the basis of magnetic flux according to the current; and a casing including a first housing portion housing the second terminal connection portion, and a second housing portion housing the coupling portion and the current sensor.

9 Claims, 6 Drawing Sheets

(52) U.S. Cl.
CPC ......... *G01R 33/02* (2013.01); *H01R 13/6691* (2013.01); *H01R 24/28* (2013.01); *G01R 15/202* (2013.01); *G01R 19/0092* (2013.01); *H01R 11/12* (2013.01); *H01R 13/24* (2013.01)

(58) Field of Classification Search
CPC .... G01R 15/207; G01R 15/202; G01R 33/02; G01R 19/0092
USPC ......... 439/620.01, 620.03, 620.05, 638, 639, 439/797, 801
See application file for complete search history.

(56) References Cited

U.S. PATENT DOCUMENTS

| | | | | |
|---|---|---|---|---|
| 2010/0259255 | A1* | 10/2010 | Hashio | G01R 15/207 324/244 |
| 2013/0214593 | A1* | 8/2013 | Ohashi | B60R 16/03 307/10.1 |
| 2014/0132249 | A1* | 5/2014 | Loglisci | G01R 19/0092 324/144 |
| 2014/0357126 | A1* | 12/2014 | Suzuki | H01R 13/6683 439/620.01 |
| 2014/0375305 | A1 | 12/2014 | Kawase | |
| 2016/0154026 | A1* | 6/2016 | Claeys | G01R 15/185 324/127 |
| 2017/0102606 | A1* | 4/2017 | Pavis | H04N 5/2251 |
| 2018/0299370 | A1* | 10/2018 | Preischel | H05K 1/142 |
| 2018/0321281 | A1* | 11/2018 | Fukuhara | G01R 15/202 |
| 2018/0321283 | A1* | 11/2018 | Sei | G01R 1/18 |
| 2018/0342841 | A1* | 11/2018 | Fukuhara | H01R 24/28 |

FOREIGN PATENT DOCUMENTS

| | | |
|---|---|---|
| JP | 2013-170984 A | 9/2013 |
| JP | 2013-196861 A | 9/2013 |
| JP | 2015-201401 A | 11/2015 |

* cited by examiner

CONNECTOR DEVICE

CROSS-REFERENCE TO RELATED APPLICATION(S)

The present application claims priority to and incorporates by reference the entire contents of Japanese Patent Application No. 2017-105281 filed in Japan on May 29, 2017.

BACKGROUND OF THE INVENTION

1. Field of the Invention

The present invention relates to a connector device.

2. Description of the Related Art

Connector devices including current sensors are known. The respective connector devices include a conductor, and current flowing in the conductor is measured by a current sensor and supplied to an external device (electronic control device etc.). This kind of connector device is disclosed in, for example, Japanese Patent Application Laid-open No. 2015-201401.

Incidentally, in a conventional connector device, to measure current flowing in a terminal fitting portion between two terminals, a current sensor is disposed at the terminal fitting portion. Thus, the connector device also needs to be provided with a housing space for the current sensor in a housing portion of a casing storing the terminal fitting portion. Therefore, the size of the connector device may be increased. Furthermore, in the conventional connector device, a signal connector for supplying an output signal from the current sensor to an external device is provided at an individual connector, and the signal connectors being fitted to each other are disposed at the terminal fitting portion to fit the signal connectors upon fitting the connectors. Therefore, in the connector device, the housing portion of the casing in which the terminal fitting portion and the current sensor are housed needs to be also provided with a housing space for the signal connectors being fitted to each other. Therefore, the size of the connector device may be increased.

SUMMARY OF THE INVENTION

An object of the present invention is to provide a connector device which includes a current sensor while suppressing an increase in size of the connector device.

In order to achieve the above mentioned object, a connector device according to one aspect of the present invention includes a connection terminal that includes a first terminal connection portion electrically connected to a first counterpart terminal, a second terminal connection portion electrically connected to a second counterpart terminal, and a coupling portion that has a flat plate shape, disposed between the first terminal connection portion and the second terminal connection portion, and electrically connected between the first terminal connection portion and the second terminal connection portion; a current sensor that measures current flowing in the coupling portion on the basis of magnetic flux according to the current; and a casing that includes a first housing portion housing the second terminal connection portion, and a second housing portion housing the coupling portion and the current sensor.

According to another aspect of the present invention, in the connector device, it is possible to configure that the current sensor includes a signal outputting device that transmits a current measurement signal to an external device, and the signal outputting device projects outward from an outer wall surface on a side different from a side of the first housing portion of outer wall surfaces of a wall body constituting the second housing portion.

According to still another aspect of the present invention, in the connector device, it is possible to configure that in the current sensor, a magnetic core member, a magnetic sensor, and a magnetic shield member are disposed in the second housing portion and a signal outputting device is disposed from the inside to the outside of the second housing portion, the magnetic core member having a core body provided with a gap portion that has a slit shape extending in a cylinder axis direction of a cylindrical body internally spaced to surround the coupling portion, the magnetic core member generating magnetic flux according to current flowing in the coupling portion, the magnetic sensor outputting a signal according to magnetic flux density in the gap portion, the magnetic shield member having a shield body that surrounds the core body from outside to block magnetism between the inside and outside of the shield body by using the shield body, the signal outputting device transmitting a current measurement signal based on an output signal from the magnetic sensor to an external device, and the signal outputting device projects outward from an outer wall surface on a side different from a side of the first housing portion of outer wall surfaces of a wall body constituting the second housing portion.

According to still another aspect of the present invention, in the connector device, it is possible to configure that in an alternating-current circuit having a plurality of the connection terminals, the current sensor is provided for each of the connection terminals.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of a connector device according to the present invention will be described in detail below with reference to the drawings. It should be noted the present invention is not limited to the embodiment.

Embodiment

An embodiment of a connector device according to the present invention will be described with reference to FIGS. 1 to 6.

Figure 1:
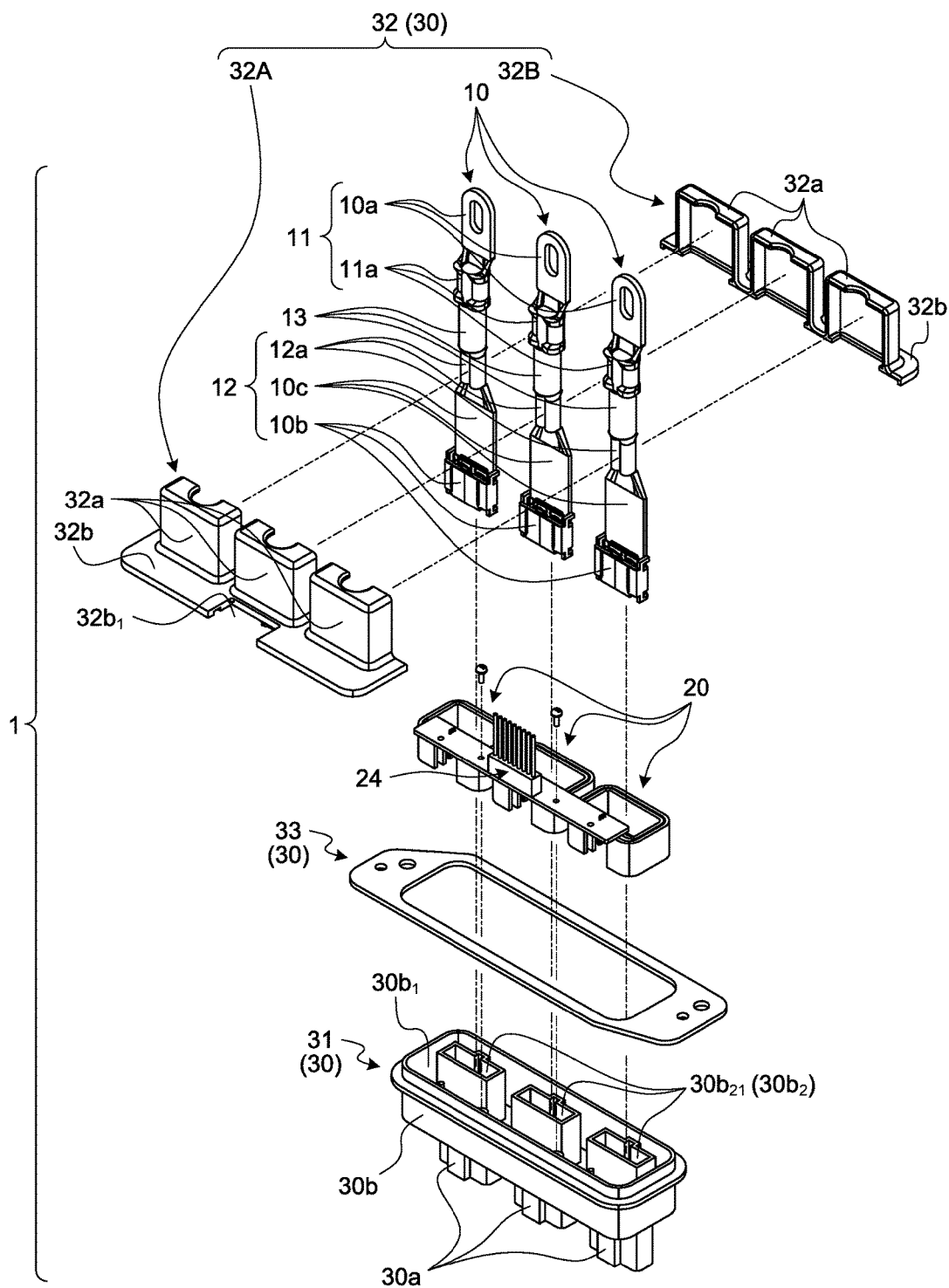
FIG. 1 is an exploded perspective view of a connector device according to an embodiment.
Figure 2:
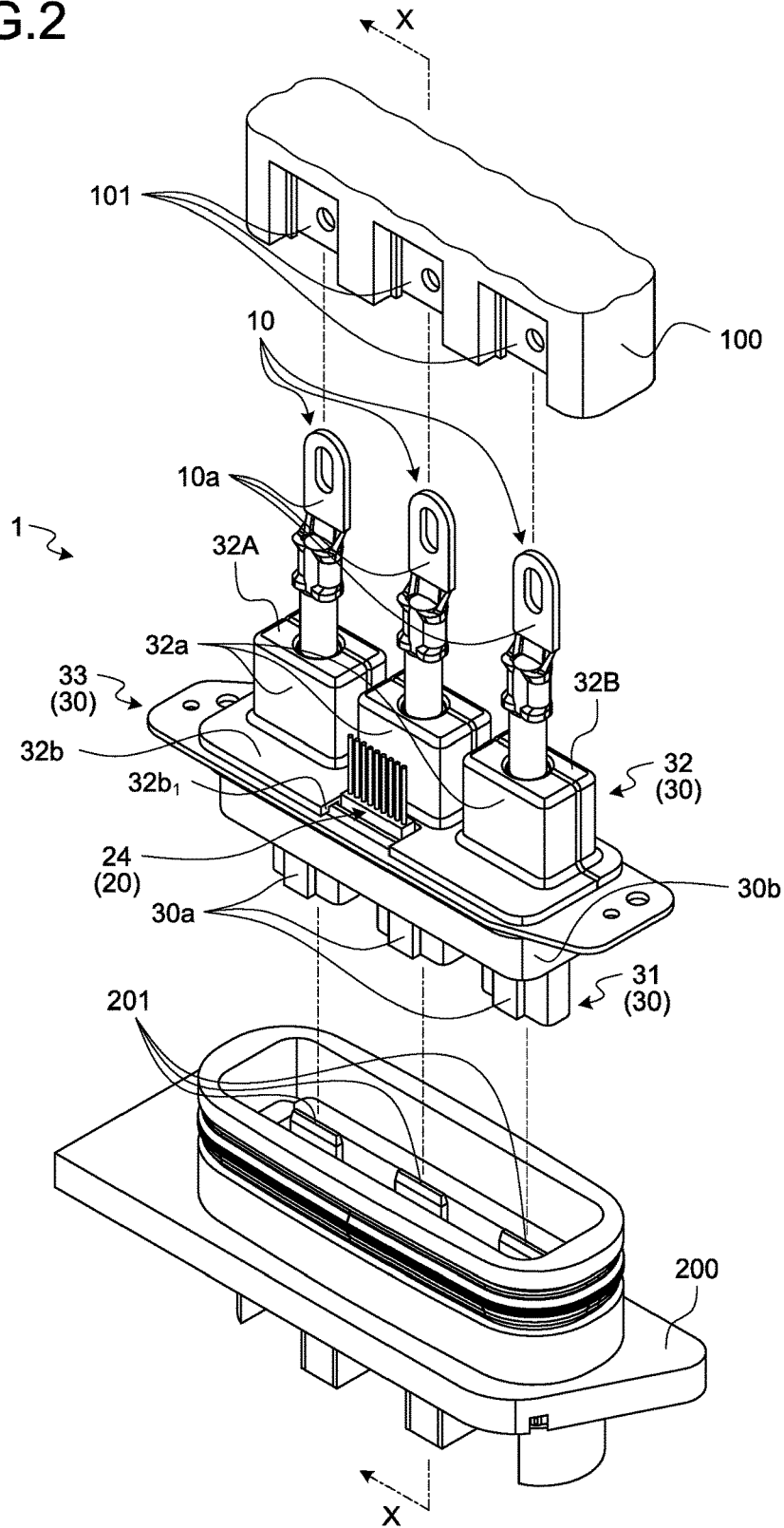
FIG. 2 is a perspective view of a connector device according to an embodiment, illustrated with devices to which the connector device is to be connected.
Figure 3:
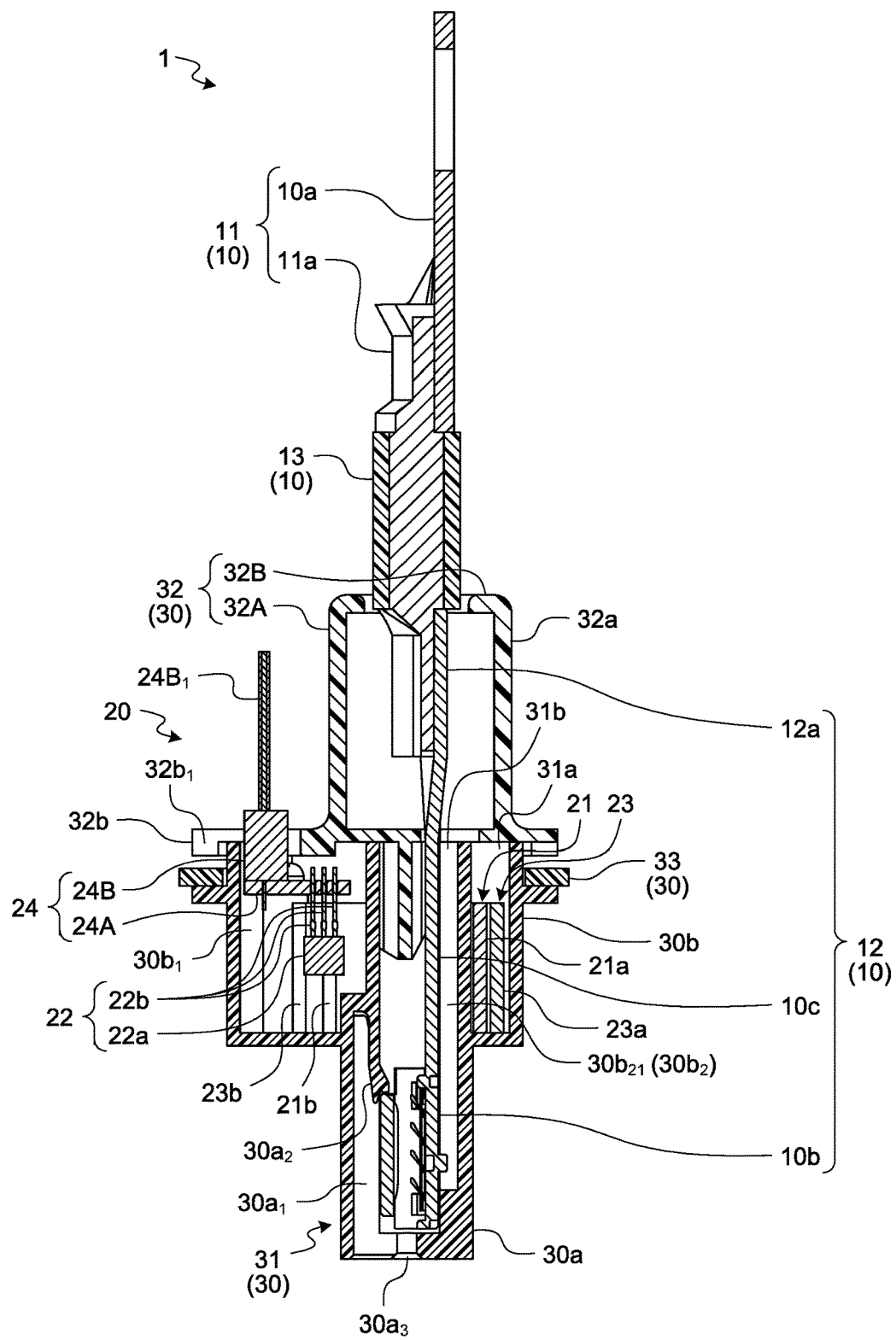
FIG. 3 is an enlarged view of the connector device taken along line X-X of FIG. 2.

In FIGS. 1 to 3, reference sign 1 denotes a connector device according to the present embodiment. The connector device 1 is disposed between two devices to which the connector device is to be connected (first connection target device 100, second connection target device 200) (FIG. 2) to electrically connects the two devices. For example, when the connector device 1 is mounted on a vehicle including a rotating machine as a drive source (electric vehicle, hybrid vehicle, or the like), the connector device 1 is disposed between an inverter as the first connection target device 100 and the rotating machine as the second connection target device 200. The first connection target device 100 includes a terminal (hereinafter, referred to as "first counterpart terminal") 101 for each phase of a three-phase alternating-current circuit. Furthermore, the second connection target device 200 includes a terminal (hereinafter, referred to as "second counterpart terminal") 201 for each phase of the three-phase alternating-current circuit.

The connector device 1 includes a connection terminal 10, a current sensor 20, and a casing 30 (FIGS. 1 to 3). In the connector device 1, the connection terminal 10 and the current sensor 20 is housed in a pair in the casing 30. Furthermore, the connector device 1 is provided with at least one pair of the connection terminal 10 and the current sensor 20. For example, in an alternating-current circuit having a plurality of the connection terminals 10, the current sensor 20 is provided for each of the connection terminals 10. In this example of the connector device 1, one pair of the connection terminal 10 and the current sensor 20 is provided for each phase of the three-phase alternating-current circuit in the first connection target device 100 and the second connection target device 200.

Figure 4:
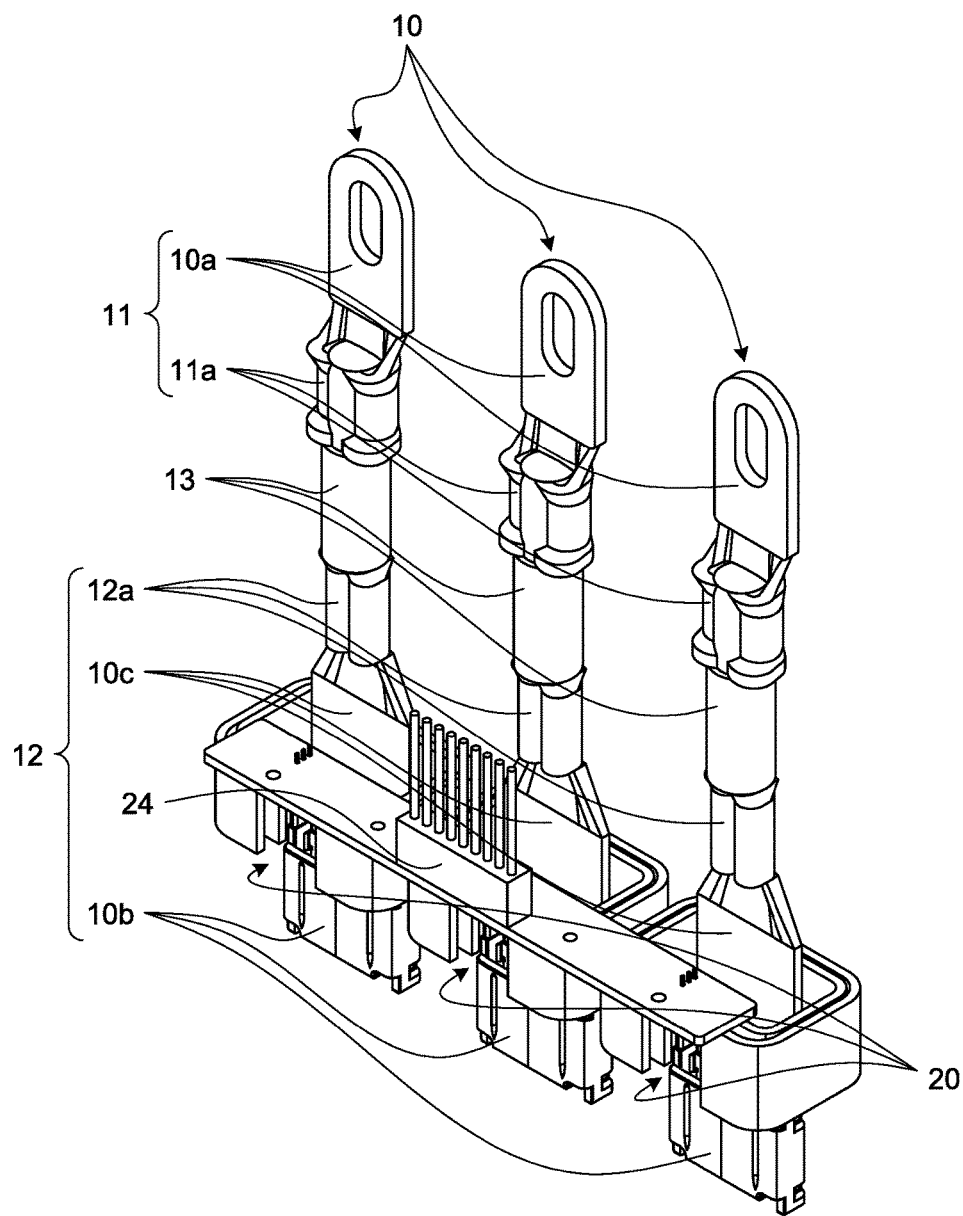
FIG. 4 is a perspective view of the connector device, illustrating connection terminals and current sensors.

The connection terminal 10 electrically connects the first connection target device 100 and the second connection target device 200 in the same phase. The connection terminal 10 includes a first terminal connection portion 10a electrically connected to the first counterpart terminal 101 of the first connection target device 100, and a second terminal connection portion 10b electrically connected to the second counterpart terminal 201 of the second connection target device 200 (FIG. 1, FIG. 3, and FIG. 4). In this example, the first terminal connection portion 10a is disposed to project from the casing 30, and fixed to the first counterpart terminal 101 with a screw. In contrast, the second terminal connection portion 10b is fixedly fitted to the second counterpart terminal 201, in this example. Here, the second terminal connection portion 10b is formed into a female terminal shape, and the second counterpart terminal 201 is formed into a male terminal shape (specifically, male tub shape).

Furthermore, the connection terminal 10 includes a flat coupling portion 10c disposed between the first terminal connection portion 10a and the second terminal connection portion 10b to electrically connect the first terminal connection portion 10a and the second terminal connection portion 10b (FIG. 1, FIG. 3, and FIG. 4).

The connection terminal 10 may be formed of one electrically conductive member or may be formed by assembling a plurality of electrically conductive members. In this example, the connection terminal 10 includes a first terminal fitting 11 having the first terminal connection portion 10a, a second terminal fitting 12 having the second terminal connection portion 10b and the coupling portion 10c, and a wire 13 for coupling the first terminal fitting 11 and the second terminal fitting 12 (FIG. 1, FIG. 3, and FIG. 4). The first terminal fitting 11 includes a wire connection portion 11a physically and electrically connected to one end of the wire 13. The wire connection portion 11a is fixedly press-fitted to the one end of the wire 13 by crimping or the like. The second terminal fitting 12 includes a wire connection portion 12a physically and electrically connected to the other end of the wire 13. The wire connection portion 12a is fixedly press-fitted to the other end of the wire 13 by crimping or the like. In the second terminal fitting 12, the coupling portion 10c is disposed between the second terminal connection portion 10b and the wire connection portion 12a. In this example, the coupling portion 10c has a flat surface extending in a direction in which the second terminal connection portion 10b and the second counterpart terminal 201 are inserted or removed relative to each other. The wire 13 is provided for alignment of the connection terminal 10 between the first counterpart terminal 101 and the second counterpart terminal 201.

Figure 5:
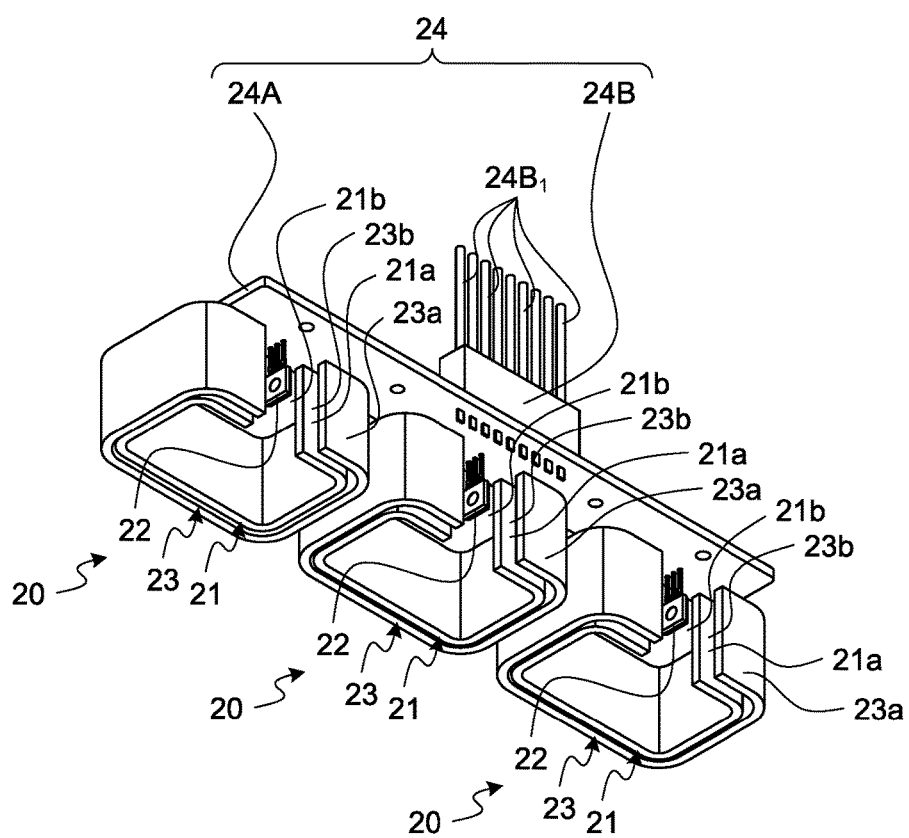
FIG. 5 is a perspective view of the current sensors viewed from another angle.
Figure 6:
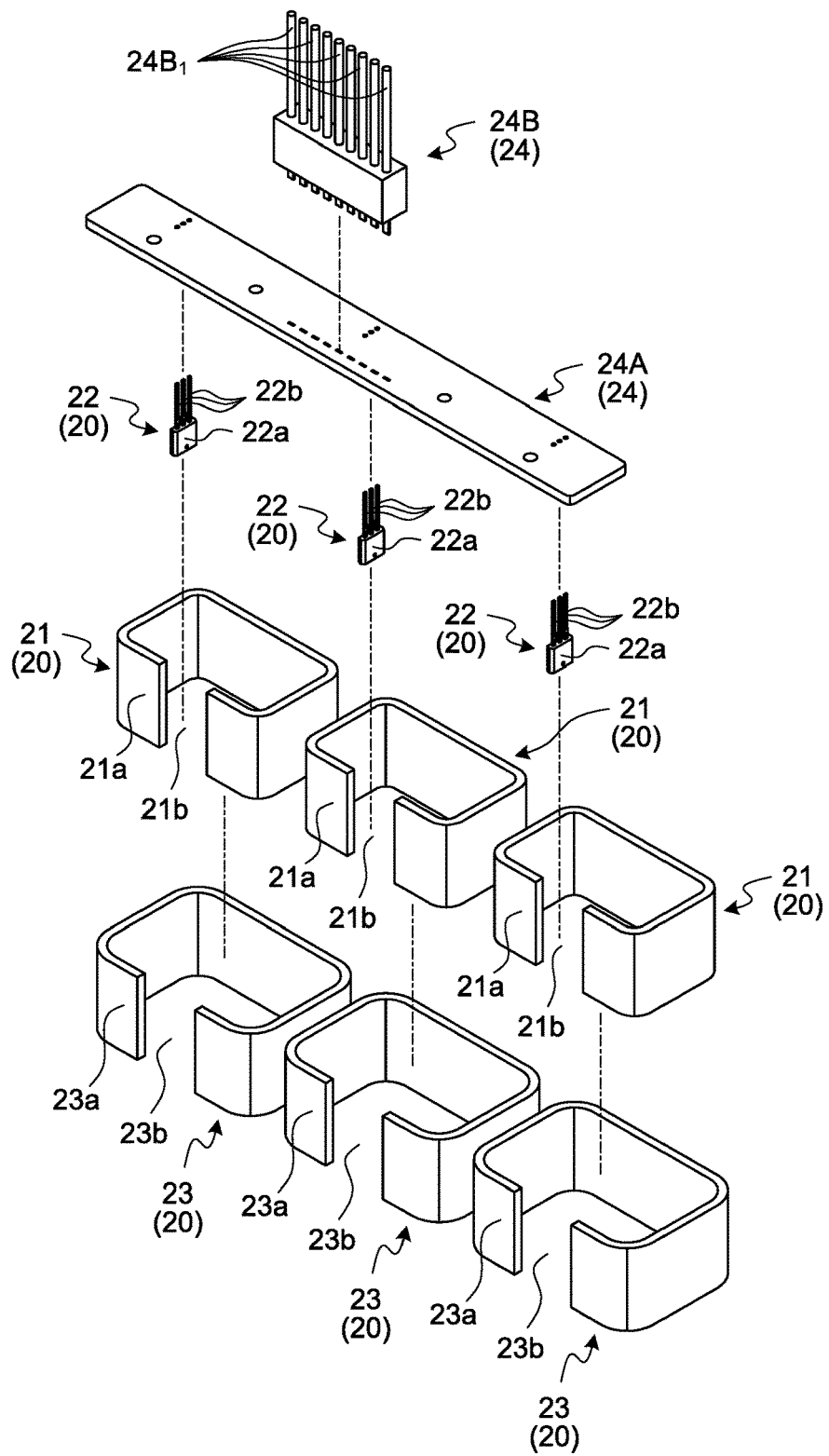
FIG. 6 is an exploded perspective view of the current sensors.

The current sensor 20 is configured to measure current flowing in the connection terminal 10. The current sensor 20 measures current flowing in the coupling portion 10c on the basis of magnetic flux according to the current. The current sensor 20 includes a magnetic core member 21, a magnetic sensor 22, a magnetic shield member 23 (FIG. 3, FIG. 5, and FIG. 6). Furthermore, the current sensor 20 includes a signal outputting device 24 (FIGS. 1 to 6).

The magnetic core member 21 is a member generating magnetic flux according to current flowing in the coupling portion 10c and is formed of a magnetic material, such as ferrite. The magnetic core member 21 includes a core body 21a (FIG. 3, FIG. 5, and FIG. 6). The core body 21a is formed into a substantially cylindrical body internally spaced to surround the coupling portion 10c, and the cylindrical body is formed with a gap portion 21b having a slit shape extending in a cylinder axis direction of the cylindrical body. In this example, the core body 21a is provided with the gap portion 21b in one of four walls of the cylindrical body having a square cylindrical shape. The gap portion 21b is formed into a rectangular shape in an intermediate portion of the wall.

In the magnetic core member 21, the coupling portion 10c is inserted into the core body 21a in a cylinder axis direction, and the coupling portion 10c is disposed in the core body 21a to face the gap portion 21b. Here, one flat surface of the coupling portion 10c is disposed to face the gap portion 21b. In the coupling portion 10c, a portion disposed to face the gap portion 21b is an object of current measurement (hereinafter, referred to as "current measurement target portion").

The magnetic sensor 22 is configured to output a signal according to magnetic flux density in the gap portion 21b. The magnetic sensor 22 includes a sensor body 22a having a magnetic detection element, and conductive lead wires 22b each configured to output a signal (FIGS. 3 and 6).

In this example, a Hall integrated circuit (IC) is used as the magnetic sensor 22. The Hall IC, not illustrated, includes a Hall element as the magnetic detection element, and an amplifier circuit configured to amplify an output signal from the Hall element. The sensor body 22a includes the Hall element and the amplifier circuit. The Hall element outputs a signal (output signal) having a Hall voltage according to the magnetic flux density. For example, the Hall element is provided at a position extending in a direction perpendicular to a flat surface of the coupling portion 10c, from the substantially center in a width direction of the current measurement target portion of the coupling portion 10c, at a predetermined spaced interval. Here, the sensor body 22a of the magnetic sensor 22 is disposed in the gap portion 21b to dispose the Hall element as described above. In this magnetic sensor 22, the Hall element outputs a signal having a Hall voltage according to the magnetic flux density in the gap portion 21b, and the output signal is amplified by the amplifier circuit. In this magnetic sensor 22, the amplified output signal is output from a lead wire 22b.

The magnetic shield member 23 includes a shield body 23a configured to surround the core body 21a of the magnetic core member 21 from outside (FIG. 3, FIG. 5, and FIG. 6), and the shield body 23a blocks magnetism between the inside and outside of the shield body 23a. The magnetic shield member 23 is formed of a magnetic material, such as ferrite. The shield body 23a is formed into a substantially cylindrical body surrounding the core body 21a from outside to have a cylinder axis direction disposed to be aligned in the cylinder axis direction of the core body 21a. In this example, the shield body 23a has a gap portion 23b formed in one of four walls of the cylindrical body having a square cylindrical shape to have a slit shape in the cylinder axis direction. The gap portion 23b is formed into a rectangular shape in an intermediate portion of the wall, and is disposed to face the gap portion 21b of the magnetic core member 21, at a spaced interval outside the core body 21a.

In this current sensor 20, the magnetic core member 21, the magnetic sensor 22, and the magnetic shield member 23 are disposed in a second housing portion 30b of the casing 30, which is described later.

The signal outputting device 24 is configured to transmit a current measurement signal based on an output signal from the magnetic sensor 22 to an external device, such as an electronic control device (not illustrated). The signal outputting device 24 includes a circuit board 24A to which an output signal is input from each lead wire 22b of the magnetic sensor 22 (FIG. 3, FIG. 5, and FIG. 6). The circuit board 24A has a circuit pattern (not illustrated) to which the lead wires 22b are electrically connect. Furthermore, the signal outputting device 24 includes a signal transmission device 24B electrically connected to the circuit pattern (FIG. 3, FIG. 5, and FIG. 6). The signal transmission device 24B is electrically connected to the external device to transmit the current measurement signal based on an output signal from the magnetic sensor 22 to the external device. In this example, the signal transmission device 24B includes wires $24B_1$, and the current measurement signal is transmitted to the external device via each of the wires $24B_1$.

The signal outputting device 24 is disposed from the inside to the outside of the second housing portion 30b of the casing 30, which is described later. Specifically, the signal outputting device 24 projects outward from an outer wall surface on a side different from the side of a first housing portion 30a of the casing 30, which is described later, of outer wall surfaces of a wall body constituting the second housing portion 30b. In the signal outputting device 24, the circuit board 24A is disposed in the second housing portion 30b, and the signal transmission device 24B is disposed from the inside to the outside of the second housing portion 30b. In the signal transmission device 24B, the wires $24B_1$ are disposed outside the second housing portion 30b.

The casing 30 is formed of an insulation material, such as synthetic resin. As described above, the connection terminal 10 and the current sensor 20 are housed in a pair in the casing 30, and the casing 30 houses three pairs of the connection terminals 10 and the current sensors 20. The casing 30 includes the first housing portion 30a configured to house the second terminal connection portion 10b of the connection terminal 10, and the second housing portion 30b configured to house the coupling portion 10c of the connection terminal 10 and the current sensor 20 (FIGS. 1 to 3).

The first housing portion 30a is formed into a cylindrical shape and is provided for each connection terminal 10. The first housing portion 30a includes an inner space $30a_1$ in which the second terminal connection portion 10b is house and held (FIG. 3). The second terminal connection portion 10b is inserted in the cylinder axis direction to a housing completion position in the inner space $30a_1$. When the second terminal connection portion 10b is inserted to the housing completion position in the inner space $30a_1$ movement in a direction opposite to the insertion direction is locked by a lance $30a_2$ provided in the inner space $30a_1$. The first housing portion 30a includes an opening portion $30a_3$ communicating with the inner space $30a_1$ at one end in the cylinder axis direction (FIG. 3). The opening portion $30a_3$ is used as an insertion hole for the second counterpart terminal 201. The respective first housing portions 30a are aligned in line so that the opening portions $30a_3$ face in the same direction at spaced intervals.

The second housing portion 30b is formed into a cylindrical shape to collectively house all combinations of the coupling portions 10c of the connection terminals 10 and the current sensors 20. The second housing portion 30b includes an inner space $30b_1$ in which all combinations of the coupling portions 10c of the connection terminals 10 and the current sensors 20 (FIGS. 1 and 3). In this example, a cylindrical terminal housing portion $30b_2$ is provided in the inner space $30b_1$, for each coupling portion 10c. Each respective terminal housing portion $30b_2$ includes an inner space $30b_{21}$ communicating with the inner space $30a_1$ of a corresponding first housing portion 30a, and the terminal housing portion $30b_2$ is connected to the corresponding first housing portion 30a so that the cylinder axis directions thereof are aligned with each other. The terminal housing portion $30b_2$ has one end in the cylinder axis direction communicating with the other end of the first housing portion 30a in the cylinder axis direction. The current sensor 20 is disposed to surround the terminal housing portion $30b_2$ and held in the second housing portion 30b by a hardened potting liquid filled in the second housing portion 30b.

Specifically, in this example, the casing 30 includes a housing 31 and a cover 32 (FIGS. 1 to 3).

The housing 31 includes the first housing portion 30a and the second housing portion 30b. The housing 31 includes an opening portion 31a at the other end of the second housing portion 30b in the cylinder axis direction (FIG. 3). The opening portion 31a is disposed on a side opposite to the opening portion $30a_3$ of the first housing portion 30a, and used as an insertion hole for the current sensor 20. The signal transmission device 24B projects outward from the second housing portion 30b through the opening portion 31a. Furthermore, the housing 31 includes an opening portion 31b at the other end of the terminal housing portion $30b_2$ in the cylinder axis direction (FIG. 3). The opening portion 31b is disposed on a side opposite to the opening portion $30a_3$ of the first housing portion 30a, and used as an insertion hole for the connection terminal 10.

The cover 32 closes the opening portion 31a of the closing housing 31 to house the wire connection portions 11a of the first terminal fittings 11 and the wires 13 in the connection terminals 10. The cover 32 includes terminal housing portions 32a housing the wire connection portions 11a and the wires 13 for the respective connection terminals 10, and a flange portion 32b provided at the peripheral edge of the respective terminal housing portions 32a (FIGS. 1 to 3).

In this example, the cover 32 includes a first cover member 32A and a second cover member 32B (FIGS. 1 to 3). The first cover member 32A and the second cover member 32B are fitted to each other to hold the wire connection portions 11a of the connection terminals 10 and the wires 13, and mounted on the housing 31.

In this example, the casing 30 is configured so that the flange portion 32b of the cover 32 is also formed as the wall body constituting the second housing portion 30b. In this example, the signal outputting device 24 projects outward from the outer wall surface of the flange portion 32b. Therefore, the flange portion 32b includes a cut-out portion $32b_1$ configured to insert the signal transmission device 24B of the signal outputting device 24 therein (FIGS. 1 to 3). The signal transmission device 24B is disposed from the inside to the second housing portion 30b via the cut-out portion $32b_1$.

Note that the casing 30 is provided with a plate member 33 surrounding the housing 31 like a flange (FIGS. 1 to 3).

As described above, since the first terminal connection portion 10a and the second terminal connection portion 10b of the connection terminal 10 are not the objects of current measurement, the connector device 1 according to the present embodiment does not need to dispose the current sensor in consideration of the connection with the first counterpart terminal 101 or the second counterpart terminal 201. Thus, the connector device 1 can suppress an increase in size of the connector device 1 at the first terminal connection portion 10a and the second terminal connection portion 10b, and further suppress an increase in size of the first connection target device 100 and the second connection target device 200. In contrast, in the connector device 1 according to the present embodiment, since the coupling portion 10c of the connection terminal 10 is the object of current measurement, the size of the connector device 1 may be increased at the coupling portion 10c, but the coupling portion 10c is formed into a flat plate shape and then the current sensor 20 is disposed at the coupling portion 10c. For example, the current sensor 20 is disposed to surround the coupling portion 10c having the flat plate shape. Thus, in the connector device 1, the current sensor 20 can be reduced in size compared with when the first terminal connection portion 10a and the second terminal connection portion 10b are the object of current measurement. Thus, the connector device 1 can suppress an increase in size as much as possible. Then, the connector device 1 can reduce an influence on an increase in size of the first connection target device 100 or the second connection target device 200, depending on the shapes of the first connection target device 100 and the second connection target device 200. As described above, the connector device 1 according to the present invention can include the current sensor 20, while suppressing an increase in size of the connector device and the other devices (the first connection target device 100, the second connection target device 200).

Furthermore, after the signal outputting device 24 of the current sensor 20 is provided at a position not influenced by the connection of the first terminal connection portion 10a and the second terminal connection portion 10b with the first counterpart terminal 101 and the second counterpart terminal 201, the connector device 1 according to the present embodiment disposes the signal transmission device 24B outside the casing 30. Thus, from this point, the connector device 1 can also suppress an increase in size of the connector device 1 and the other devices (the first connection target device 100, the second connection target device 200).

Furthermore, since the connector device 1 according to the present embodiment includes all configurations of the current sensor 20, including the signal outputting device 24, the number of components can be reduced compared with a connector device in which current sensors are distributed between two fitted connectors, leading to a reduction in cost.

In the connector device according to the present embodiment, since a connection terminal has a first terminal connection portion and a second terminal connection portion which are not objects of current measurement, the current sensor does not need to be disposed in consideration of the connection with a first counterpart terminal or a second counterpart terminal. Thus, the connector device can suppress an increase in size of the connector device at the first terminal connection portion and the second terminal connection portion, and further suppress an increase in size of a first connection target device and a second connection target device. In contrast, in the connector device according to the present invention, since the connection terminal has a coupling portion which is an object of current measurement, the size of the connector device may be increased at the coupling portion, but the coupling portion is formed into a flat plate shape and then the current sensor is disposed at the coupling portion. Thus, in the connector device, the current sensor can be reduced in size compared with when the first terminal connection portion and the second terminal connection portion are the object of current measurement. Thus, the connector device can suppress an increase in size as much as possible. Then, the connector device can reduce an influence on an increase in size of the first connection target device or the second connection target device, depending on the shapes of the first connection target device and the second connection target device. As described above, the connector device according to the present invention can include the current sensor, while suppressing an increase in size of the connector device and the other devices (the first connection target device, the second connection target device).

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A connector device comprising:
a connection terminal that includes a first terminal connection portion electrically connected to a first counterpart terminal, a second terminal connection portion electrically connected to a second counterpart terminal, and a flat plate coupling portion disposed between the first terminal connection portion and the second terminal connection portion, and electrically connected between the first terminal connection portion and the second terminal connection portion;
a current sensor that measures current flowing in the flat plate coupling portion on the basis of magnetic flux according to the current; and
a casing that includes a first housing portion housing the second terminal connection portion, and a second housing portion housing the flat plate coupling portion and the current sensor, wherein
a thickness direction of the flat plate coupling portion is a direction orthogonal to a direction from the first terminal connection portion toward the second terminal connection portion.

2. The connector device according to claim 1, wherein
the current sensor includes a signal outputting device that transmits a current measurement signal to an external device, and
the signal outputting device projects outward from an outer wall surface on a side different from a side of the first housing portion of outer wall surfaces of a wall body constituting the second housing portion.

3. The connector device according to claim 1, wherein
in the current sensor, a magnetic core member, a magnetic sensor, and a magnetic shield member are disposed in the second housing portion and a signal outputting device is disposed from the inside to the outside of the second housing portion, the magnetic core member having a core body provided with a gap portion that has a slit shape extending in a cylinder axis direction of a cylindrical body internally spaced to surround the flat plate coupling portion, the magnetic core member generating magnetic flux according to current flowing in the flat plate coupling portion, the magnetic sensor outputting a signal according to magnetic flux density in the gap portion, the magnetic shield member having a shield body that surrounds the core body from outside to block magnetism between the inside and outside of the shield body by using the shield body, the signal outputting device transmitting a current measurement signal based on an output signal from the magnetic sensor to an external device, and
the signal outputting device projects outward from an outer wall surface on a side different from a side of the first housing portion of outer wall surfaces of a wall body constituting the second housing portion.

4. The connector device according to claim 1, wherein
in an alternating-current circuit having a plurality of the connection terminals, the current sensor is provided for each of the connection terminals.

5. The connector device according to claim 2, wherein
in an alternating-current circuit having a plurality of the connection terminals, the current sensor is provided for each of the connection terminals.

6. The connector device according to claim 3, wherein
in an alternating-current circuit having a plurality of the connection terminals, the current sensor is provided for each of the connection terminals.

7. The connector device according to claim 1, wherein
the current sensor opposes the flat plate coupling portion in the thickness direction of the flat plate coupling portion.

8. The connector device according to claim 1, wherein
the current sensor surrounds the flat plate coupling portion.

9. The connector device according to claim 1, wherein
the flat plate coupling portion extends through the current sensor.

* * * * *